United States Patent [19]

Iwasa et al.

[11] Patent Number: 4,684,054
[45] Date of Patent: Aug. 4, 1987

[54] AUTOMATIC SOLDERING APPARATUS AND METHOD OF USING THE FLUX TO HEAT THE CIRCUIT BOARD

[75] Inventors: Yamahiro Iwasa; Atsushi Kabe, both of Hachioji; Yoichi Oba, Higashiyamato, all of Japan

[73] Assignee: Asahi Chemical Research Laboratory Co., Ltd., Japan

[21] Appl. No.: 838,825

[22] Filed: Mar. 12, 1986

[30] Foreign Application Priority Data

Mar. 30, 1985 [JP] Japan .................................. 60-67707
Apr. 19, 1985 [JP] Japan .................................. 60-85266

[51] Int. Cl.$^4$ .................................................. B23K 1/20
[52] U.S. Cl. .................................. 228/180.1; 228/33; 228/36; 228/37; 228/232
[58] Field of Search .................... 228/31, 35, 36, 37, 228/207, 180.1, 180.2, 264, 232; 148/23, 24, 25, 26; 118/410, 411, 412

[56] References Cited

U.S. PATENT DOCUMENTS

| | | | |
|---|---|---|---|
| Re. 30,399 | 9/1980 | Ammann et al. | 228/37 |
| 3,482,755 | 12/1969 | Raciti | 228/180.1 |
| 3,765,591 | 10/1973 | Cook | 228/180.1 |
| 4,055,217 | 10/1977 | Chu et al. | 228/180.1 |
| 4,060,191 | 11/1977 | Choby | 148/24 |
| 4,113,526 | 9/1978 | Stayner et al. | 148/23 |
| 4,180,419 | 12/1979 | Thompson | 148/23 |
| 4,196,839 | 4/1980 | Davis | 228/35 |
| 4,392,049 | 7/1983 | Bentley et al. | 228/180.1 |

Primary Examiner—M. Jordan
Attorney, Agent, or Firm—Robert F. Ziems

[57] ABSTRACT

An automatic soldering apparatus and method thereof is described, wherein a flux is heated up to a predetermined temperature, and is then contacted to a face of a printed base board to thereby coat the base board and to simultaneously heat the latter with the heated flux and then the heated base board is contacted to a melted solder, and wherein provided in combination are apparatus for transporting the base board, apparatus for coating the base board with the heated flux, the flux coating apparatus including a tank in which the flux is stored, heating elements for heating the flux up to a predetermined temperature such that the heated flux is coated on the face of the base board, the heated flux simultaneously heating the base board when the latter is transported to the flux storing tank, and apparatus for soldering the flux coated and heated base board, the soldering apparatus including a tank in which a melted solder is stored which is contacted to the base board when the latter is transported to the tank, and wherein the flux is a solution or a mixture of a solvent which is incombustible and of low evaporability, an activator which may be activated by a temperature higher than that of the heated flux and is stabilized with the temperature of the heated flux and an additive which is easily soluble with the solvent and the activator.

12 Claims, 12 Drawing Figures

AUTOMATIC SOLDERING APPARATUS AND METHOD OF USING THE FLUX TO HEAT THE CIRCUIT BOARD

BACKGROUND OF THE INVENTION

The invention relates to an automatic soldering apparatus and method thereof wherein more particularly a flux is heated and is brought in contact with a face of a board to be soldered, so as to simultaneously coat and preliminarily heat the board with the flux to thereby accelerate the soldering operation, and to dispense with the conventional pre-heater or to reduce the size thereof to thereby considerably save the electric power and accordingly reduce the size of the soldering apparatus.

So far, the process for soldering the printed circuit base board has been carried out in the order of coating the flux on the board, preliminary heating of the board, soldering the board and then cooling the board. Further the flux thus used has been a resin added with an activator such as hydrochloride of low amine such as ethyl amine and dissolved with a solvent such as isopropyl alcohol (IPA).

It is well known that the flux has the effects by the activator thereof to eliminate oxide on the metalic face of printed circuit base board and on the metalic face of electronic elements to be soldered to the board and by the resin thereof to lower the surface tension of solder and to prevent the metal from being oxidized. Further the isopropyl alcohol has an effect not only to be the solvent of the activator and resin but also to be the diluent for giving an even coating of solder to the printed circuit base board and to control the coating amount of the flux thereto. The flux is normally used in a foaming condition and only in the normal temperature.

The preliminary heating is made to eliminate the solvent in the liquid flux and to activate the activator thereof and also to preliminarily heat the printed circuit base board. More precisely the preliminary heating is firstly designed to completely volatilize the solvent from the flux so as to prevent the solvent from being otherwise explosively volatilized when the solder of high temperature contracts the solvent in the next soldering step because such a phenomenon is an obstacle against the even coating of solder, secondly to further activate the activator in the flux by the preliminary heating, and further to increase the temperature of the printed circuit base board itself to reduce the difference between the board and the heated solder to thereby mitigate the heat shock in the next soldering step. Thus the preliminary heating is generally set to heat the printed circuit base board up to 40° C–120° C.

Figure 11:
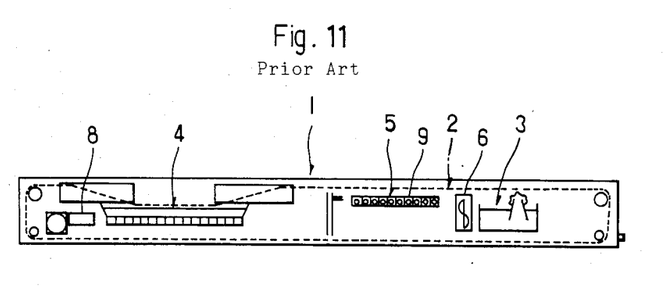
FIG. 11 is a diagramatic representation of a conventional automatic soldering apparatus.
Figure 12:
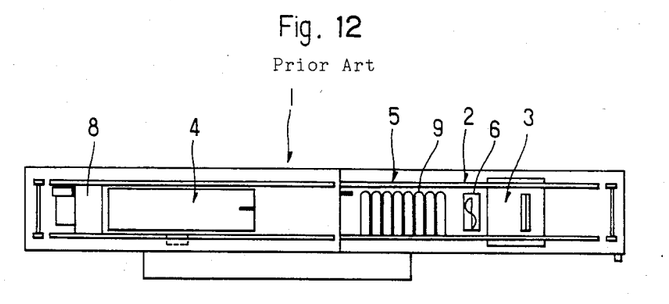
FIG. 12 is a plan view of the apparatus as shown in FIG. 11.

Namely in reference to FIGS. 11 and 12, the conventional automatic soldering apparatus 1 is substantially composed of a device 2 for transporting the base board to be soldered, a flux coating device 3, a tank 4 for storing melted solder, a preliminary heating device 5, an air curtain producing device 6 and a cooling device 8. The preliminary heating device 5 has a heater 9 such as a nichrome wire heater or an infrared radiation heater for heating the air in a limited space to indirectly heat the board to be soldered. The solder storing tank 4 is provided to contact the board to the melted solder by way of dipping the board into the melted solder or of jetting the melted solder to the board. The cooling is done generally by a fan which blows cool air on the soldered board. This is to rapidly cool down the heated solder and simultaneously to reduce the damage to the board by the heat.

However according to the conventional automatic soldering apparatus in which the flux coating device 3 is provided to coat the flux of normal temperature on the board to be soldered, which is to be heated by the separate preliminary heating device 5, there have been the following defects:

1. Since the apparatus includes a process to deal with the flux foamed up and containing a highly ignitable organic solvent and immediately thereafter a process to heat the flux to eliminate the solvent from the flux, it is unavoidable to set the ignitable element and the heating element in the neighborhood to each other. Thus there has been a danger of fire.

2. Since the apparatus requires a considerable amount of heat not only to evaporate the organic solvent but also to heat the board to be soldered by way of a heater heating the air stratum in a limited space, the heat conduction rate is very small and also the heat capacity is small due to a low density of the air, and accordingly the heat efficiency is very low. Therefore it becomes necessary to increase the number of heaters or to extend the heating time. As the result, a great deal of electric power is required. As is seen in FIGS. 11 and 12, the preliminary heating device 5 is so bulky as to occupy about 20 percent of the length of the automatic soldering device 1.

3. According to the conventional soldering apparatus, it is practically impossible to evenly heat in a short time the board to be soldered which is of large heat capacity or of low heat conductance such as a big sized multi-layer base board or a ceramic base board. Thus there has been a possibility of producing incompletely soldered products.

OBJECTS AND SUMMARY OF THE INVENTION

The invention has been provided to eliminate the defects and disadvantages of the prior art. It is therefore an object of the invention to use a flux containing no conventional organic solvent, but a mixture or solution of a nonflamable or substantially non-ignitable and substantially nonevaporative, at the temperature of the heated flux, solvent, an activator which is activated at a temperature higher than that for heating the flux but is stabilized at the temperature for heating the flux and an additive which is easily dissolved with the solvent and the activator, and to use a flux coating device provided with a heater for heating the flux and to bring the heated flux into contact with a face of a base board to be soldered, thus to simultaneously carry out the coating of flux and the preliminary heating of the base board. Thus it becomes possible to dispense with the preliminary heating device or to considerably reduce the size of the same resulting in reduction of the electric power consumption and reduction of the length of the automatic soldering apparatus itself. It is another object of the invention to use a liquid flux instead of the air, as the heating medium, the liquid flux being of density and heat capacity larger than the air, to thereby increase the heat efficiency in heating the base board to be soldered. Thus it is possible to evenly heat the base plate up to a desired temperature with a minimum amount of energy and in a short time. It is another object of the invention to use the flux containing no organic solvent so as to eliminate the necessity of otherwise evaporating the organic solvent. Thus it becomes possible to avoid the loss of energy which may be caused by the evaporation heat and also to avoid the cause of public hazard and further to avoid the danger of causing a fire. It is another object of the invention to efficiently heat the base board with the heated flux so as to evenly heat in a short time a big sized base board such as a multilayer base board of large heat capacity or a ceramic base board of low heat conductance to thereby remarkably increase the coating property of solder for the big sized base board. It is another object of the invention to contact the base board to the heated flux progressively in the direction from the flux of lower temperature to the flux of higher temperature, so as to moderate the heat shock of the base board and to prevent the base board from being deformed by heating. It is another object of the invention to provide a device for removing the excess of the flux coated on the base board, which may be liable to be excessively coated due to the high temperature, to thereby recover and save the flux and further to avoid the adverse influence which may otherwise be caused in the soldering process. It is another object of the invention to use a high heat-resisting flux so as to cover the melted solder with the flux to thereby prevent the melted solder from being oxidized. It is another object of the invention to contact a fluid to the base board to cool and wash the base board after the latter has been soldered in the solder storing tank. Thus any excess flux is completely removed from the base board and simultaneously the base board is cooled down to be properly dealt with in the next process. It is still another object of the invention to heat the flux, for example, up to 100° C.–150° C. and to contact the heated flux to the base board to preliminarily heat the same. For attaining this object, an activator is used, which will not be resolved and will not be changed in quality and will maintain the activity in the soldering operation even if it is heated up to approximately 150° C. for a long time. Further an diluent is used to dissolve the actuator, which is also not resolved and is not changed in quality even if it is heated up to approximately 150° C., and which has a washing property without any poison and has an aptness to soldering. Thus it is possible to coat the base board with the flux and to preliminary heat the same simultaneously.

BRIEF DESCRIPTION OF THE DRAWINGS

The other features and advantages of the invention will be apparent from the description of the preferred embodiments in reference to the attached drawings, in which.

DETAILED DESCRIPTION OF THE INVENTION

In reference to FIGS. 1 through 4, an automatic soldering apparatus 11 of the invention is substantially composed of a transporting device 12, a flux coating device 13, a solder storing tank 14 and a heater 29 arranged in combination with the flux coating device 13.

Figure 7:
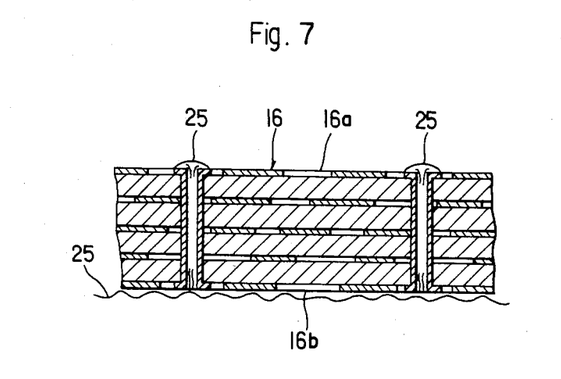
FIG. 7 is a vertically sectioned view of a multilayer base board shown as being in contact with a solder.

The transporting device 12 is provided to transport a base board 16 to be soldered as particularly shown in FIG. 7, and is composed of an endless chain 19 arranged in engagement with a number of sprockets 18, a plurality of carriers 20 each connected to the endless chain for running therewith and a chain drive mechanism (not shown). The endless chain 19 according to this embodiment is inclined down to the flux coating device 13 and to the solder storing tank 14 so that the carriers 20 each loaded with the base board 16 may come down to the flux coating device 13 and to the solder storing tank 14. The carriers 20 are each composed of a frame 21, a pair of bars 22 extented through the frame 21, laterally thereof, four wheels 23 rotatably mounted on both ends of the bars 22 and holders 24 each for holding the base board 16. One of the bars 22 has an end 22a connected to the endless chain 19 and the wheels 23 are mounted on a pair of guide rails 25. Each of the holders 24 has an upper end connected to the frame 21 and a lower end for holding the base board 16.

The solder storing tank 14 is provided rearward of the flux coating device 13. In this embodiment, the conventional preliminary heating device 5 as shown in FIG. 11 is eliminated. The solder storing tank 14 stores a melted solder 25 therein and a heater 26 is provided on the underside of the solder storing tank 4.

Figure 6:
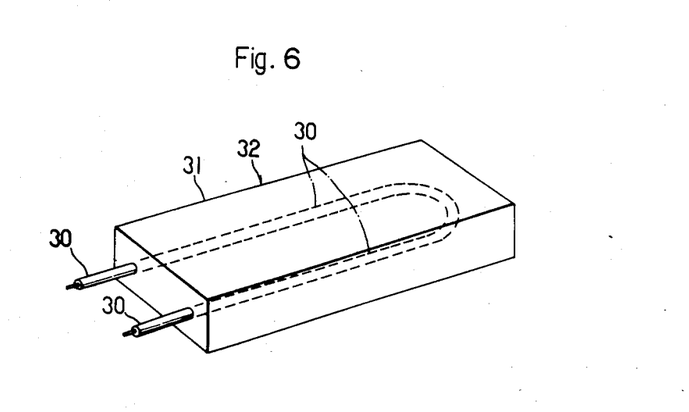
FIG. 6 is a perspective view of a flux heating device of the apparatus.

The flux coating device 13 has the heater 29 provided on the underside 28 thereof. The heater 29 is composed of a plurality of alminum heat generators 32 as shown in FIG. 6, each of which has a heat generator element 30 embeded in an aluminum block 31. The heater 29 is attached to the bottom plate 33a of a flux storing tank 33. The flux storing tank 33 has an inner side plate 33b extended upward from the bottom plate 33a and surrounding the latter and an outer side plate 34 provided all around the inner side plate 33b, and a heat isolating material 35 is provided between the inner and outer side plates. Further the flux storing tank 33 has an overflow tank 36 provided therein, which is composed of a flux supplying section 38 and a flux overflowing section 39. The two sections are divided with a shield plate 40 having an opening 40a through which the flux flows up to the flux overflowing section 39 from the flux supplying section 38. The overflow tank 36 has a bottom plate 41 having an opening 41a at which the flux is drawn into the flux supplying section. In connection with the flux supplying section, a flux recirculating pump P is provided. The pump P has an impeller 42 secured to the lower end of a rotational shaft 43 and arranged at the opening 41a. The rotational shaft 43 has a pulley 48 secured to the upper end thereof and the pulley 48 is connected by a belt 46 to a pulley 45 which is secured to a rotational shaft 44a of a motor 44 which may be driven at a variable speed.

The flux 49 stored in the tank 33 is heated up to 40° C.–120° C. by the heater 29 and is drawn into the flux supplying section 38 by the impeller 42 and then flows into the overflowing section 39 where the flux 49 overflows. The flux storing tank 33 is mounted on a base 51 and the vertical position is adjustable by four level jacks 50.

A device 52 for removing an excessive amount of flux is provided immediately rearward of the flux storing tank 33. The excessive flux removing device is composed of a plate 53 arranged as inclined down to the flux storing tank 33 and a brush 54 provided on the upward end of the plate 53. The brush 54 may be made of nylon and is so arranged to remove the excessive amount of flux 49 coated on the underside of the base board 16. Instead of such a mechanical brush, an air brush may be used to blow off the excessive amount of flux with a jet of compressed air.

A cooling and washing device 55 is provided at the rearward end of the automatic soldering device 11. The cooling and washing device 55 is designed by way of example to jet a cooling and washing fluid 56 to the base board 16 which has been soldered in the solder storing tank 14, and is composed of a casing 58 for storing therein the fluid 56, a jetting pump 59, a jetting nozzle 60 and a fluid receiving funnel 61 as particularly shown in FIG. 8. In case the flux 49 is soluble with water, the fluid 56 may be water or hot water containing 1% of caustic soda. In case the flux is not soluble with water, the fluid 56 may be a flon-family solvent such as a chlorine solvent or an alcoholic solvent.

Figure 1:
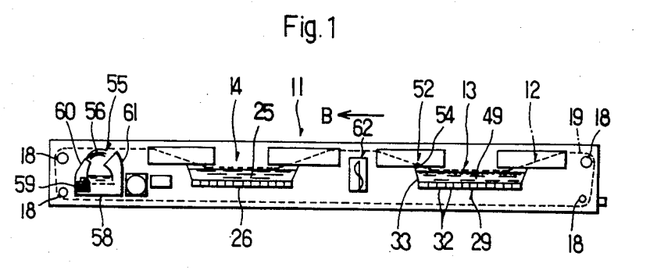
FIG. 1 is a diagramatic representation of an automatic soldering apparatus of the invention.
Figure 2:
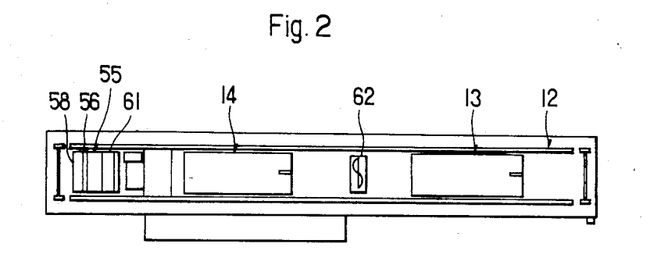
FIG. 2 is a plan view of the apparatus as shown in FIG. 1.

Further in reference to FIGS. 1 and 2, an air curtain device 62 is provided between the flux storing tank 33 and the solder storing tank 14 to maintain the temperature of the base board 16 heated at the flux coating device 13 until the base board 16 is transported to the solder storing tank 14.

Figure 5:
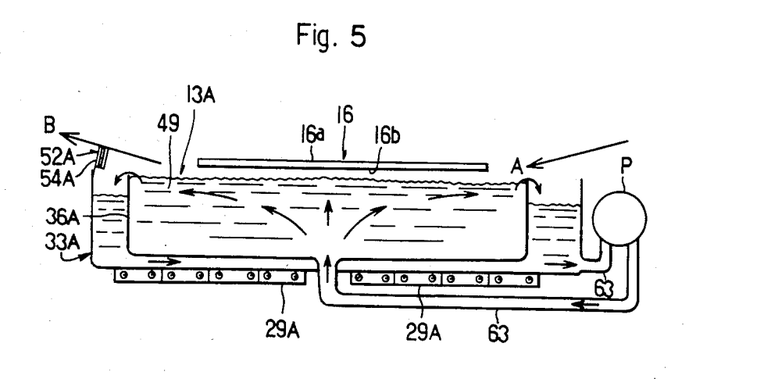
FIG. 5 is a vertically sectioned front view of a modified flux coating device.

FIG. 5 shows a modified flux coating device 13A having a flux storing tank 33A, the bottom of which has one end of a pipe 63 connected thereto, the other end of which is connected through a pump P to the bottom of the overflow section 36A, so that the overflowed flux 49 may be circulated to the overflow section 36A through the flux storing tank 33A and the pipe 63 and through the way provided between heaters 29A provided on the bottom of the flux storing tank 33A and divided into two parts. A device 52A including a brush 54A for removing the excessive amount of flux from the base board 16 is provided on the flux storing tank 33A at the top of the left end thereof as shown, so that the brush 54A may contact the underside of the flux coated base board 16 as the latter is conveyed past the brush.

Figure 9:
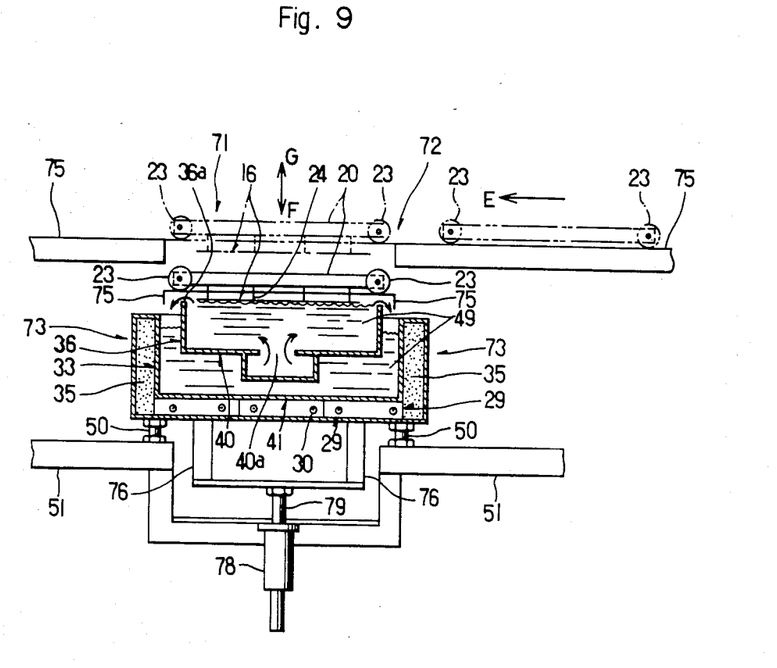
FIG. 9 is a vertically sectioned front view of another modified flux coating device of the apparatus.
Figure 10:
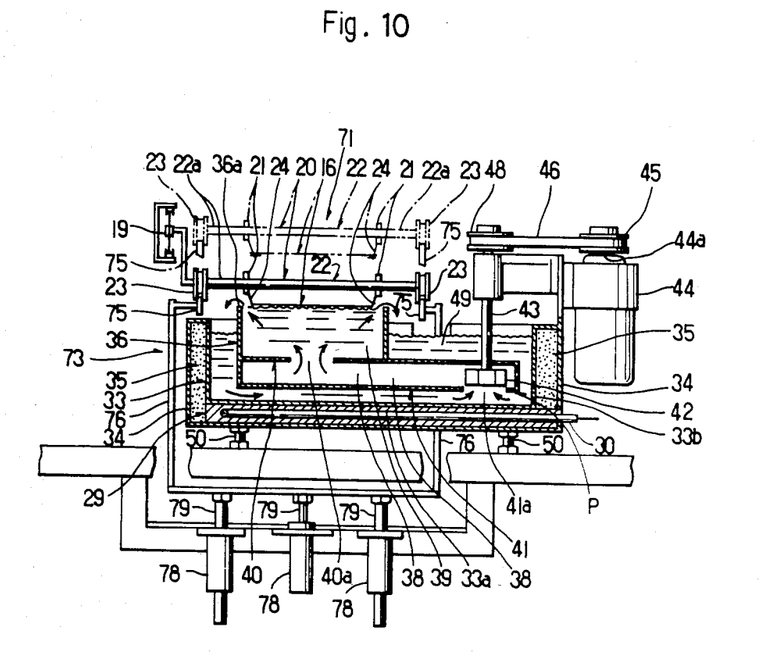
FIG. 10 is a vertically sectioned side view of the flux coating device as shown in FIG. 9.

In reference to FIGS. 9 and 10 showing another modified embodiment of the invention, in which an automatic soldering apparatus 71 is provided with a flux coating device 73 which is substantially the same as the flux coating device 13 of the first embodiment except that the flux storing tank 33 and the heater 29 are of a smaller capacity compared with those of the first embodiment. Therefore this embodiment has the same reference numerals attached thereto except to the flux coating device and the explanation is omitted. This embodiment however has a transporting device 72 including a pair of rails 75 on which the wheels 23 of the carriers 20 are mounted and which is secured to a coupling plate 76. The coupling plate is connected to a predetermined number of piston rods 79 of cylinders 78 which are activated with a predetermined timing to move the rails up and down above the flux coating device 73 and between the position as shown with the imaginary line and the solid line.

According to the embodiments as illustrated and described, the flux 49 in the flux coating device 13,13A, 73 is heated up to a predetermined temperature. It may however be possible to divide the flux storing tank 33 into a plurality of parts and accordingly to change the capacity of the individual heaters 32, so that the base boards 16 may be contacted to the flux from the flux of lower temperatures to the flux of higher temperatures progressively during the transportation of the base boards.

With the foregoing structure as described above, explanation will be given to the flux 49 to be used in combination with the automatic soldering apparatus: According to the invention, the flux 49 is used while it is normally heated up to the temperature between 40° C. and 120° C. It is therefore unavoidable that the solvent is evaporated and the activator is deteriorated, and accordingly the conventional liquid flux can not be used in the appratus of the invention. The component of flux may be determined in dependence upon the range to be set to heat the flux. In accordance with the invention, it is preferable to provide a flux composed of a mixture of a nonflamable or substantially non-ignitable, at the temperature to which the flux is normally heated, solvent, an activator and additive which is well soluble with the solvent and the activator, which activator being made active as a flux with an activating temperature and being safe against a flux heating temperature. In this invention, it is confirmed to use, for example, a flux including the tricresylphosphate (heatproof, activation-encouraging, and dissolution & filler agent), phosphoric acid (activator) and 2,3-dibromopropanol (activator), and a flux including the dibutyl diglycoladivate (heatproof, activation-encouraging and dissolution & filler agent), phosphoric acid (activator) and 2,3-dibromopropanol (activator).

The flux in accordance with the invention is heated, for example, up to 100° C.–150° C. and is contacted to the base board. The flux is therefore required to have the following properties:

(1) As the activator, not to be denatured or decomposed when heated up to 150° C. for a long time and to be active in the soldering temperature and help encourage the soldering condition, and (2) As the diluent of the activator, to dissolve the activator and not to be denatured or decomposed when heated up to 150° C. and also to help heighten the solder coating property and to be adapted to washing without giving off poisonous elements.

According to the invention, as the activator for satisfying the requirement (1), the phosphoric acid has been selected. The phosphoric acid includes orthophosphoric acid ($H_3PO_4$), pyrophosphoric acid ($H_4P_2O_7$) and metaphosphoric acid ($(HPO_3)_n$). As to the dissolution to the diluent, the orthophosphoric acid and pyrophosphoric acid are preferrable, and the former is further preferrable as to encouraging the soldering condition. Therefore it is to be assumed that the phosphoric acid mentioned hereinafter refers to the orthophosphoric acid.

On the other hand, the diluent is firstly required to dissolve the activator and to be able to withstand a high temperature when mixed with the phosphoric acid to help heighten the solder coating property. The diluent in accordance with the invention is a heat proof plasticizer which includes the phthalic acid ester, fatty acid ester, maleic acid & fumaric acid ester and orthophosphoric acid ester (heatproof).

These diluents have been tested as to the dissolution with the phosphoric acid by adding 4% by weight of phosphoric acid to 100% by weight of each diluent and then by heating the mixture with the temperature of 120° C. for one hour, and also have tested as to the soldering condition by placing several drops of the mixture together with a solder piece of 250 mg on a copper plate of 30 mm × 30 mm and then by heating the same to the temperature of 250° C. for 30 sec. The results are shown in Table 1, in which the evaluation columns are filled with the marks ⊙,○, △ and X showing the results best, good, satisfactory and not good respectively.

From the test results, selected were the tributoxyethylphosphate (TBXP), tricresylphosphate (TCP) and cresylphenylphosphate (CDP) of orthophosphoric acid ester, dibutylmaleate (DBM) of maleic acid ester, and dibutyladipate and dibutyldiglicoladipate of fatty acid ester.

It has been found that the plasticizer of orthophosphoric acid ester is proper to dissolve with the phosphoric acid instead of acting against the activity function of the phosphoric acid. Therefore a heat treatment was made as to the trisdichloropropyl phosphate (CRP) and the halogen-containing condensed phosphoric acid ester in addition to the tributoxyetylphosphate and cresyldiphenylphosphate. Namely these elements were heated to the temperature of 180° C. for one hour (corresponding to 120° C. for 64 hours), and the color tone and viscosity change were tested. It has been confirmed that the tributoxyethylphosphate, tricresylphosphate and cresyldiphenylphosphate were slightly changed to yellow but the viscosity was unchanged, while the halogen-containing orthophosphoric acid ester was changed to brown and the viscosity was remarkably increased.

Therefore it has been decided that the tributoxyethylphosphate, tricresylphosphate, tricresyldiphenylphosphate, dibutylmaleate, dibutyladipate and dibutyldiglicoladipate are used as the diluent singly or in a mixture.

The ratio between the phosphoric acid and the diluent has been explored in the region 5/1000–0.5/1000 in the family of phosphoric acid and tricresylphosphate. It has been found that at least more than 1% and preferably more than 3% by weight of phosphoric acid is needed to 100% by weight of the diluent as shown in Table 2.

TABLE 1

| Types | Names | Dissolution with phosphoric acid | Solder coating property |
|---|---|---|---|
| Phtalic acid ester | DHP diheptylphthalate | O | X |
| (structure: benzene with two –OR groups, O=C–OR) | DOP dioctylphtalate | X | X |
| | DIDP diisodecylphtalate | X | X |
| | BBP butylbenzilicphtalate | △ | △ |
| Fatty acid ester | bioctyladipate | X | X |
| CH$_2$COOR \| (CH$_2$)$_n$ \| CH$_2$COOR | DBA dibutyladipate | O | O |
| | BXA dibutyldiglicoladipate | O | O |
| | DOZ dioctylazolate | | X |
| | DBS dibutylsebacade | X | X |
| | DOS dioctylsebacode | X | X |
| Maleic acid (Fumaric acid) ester | DBM dibutylmaleate | △ | O |
| | DOM dioctylmaleate | X | X |
| | DFB dibutylfumarate | X | X |
| Orthophosphoric acid ester | TBXP tributoxyethylphosphate | O | O |
| RO—P(=O)—OR \| OR | TCP tricresylphosphate | △ | ⊙ |
| | CDP cresyldiphenylphosphate | O | O |

TABLE 2

| TCP/orthophosphoric acid (Weight ratio) | Extension of solder on Copper (mm) | |
|---|---|---|
| | Immediately after application | After 5 hours |
| 100/5 | 13 × 23 | — |
| 100/3 | 13 × 14 | 12 × 15 |
| 100/1 | 3 × 5 | 11 × 12 |
| 100/0.5 | 4 × 4 | 5 × 5 |

In addition, some additives have been tested, and it has been found that 2, 3 dibromopropanol is dissolved at the neighborhood of soldering temperature and produces a gas giving a stirring effect in the soldering flux to thereby heighten the soldering condition and the speed thereof. It has been also found that the conventional rosin and phenol rosin denatured rosin may be added.

The soldering flux thus formed is composed of phosphoric acid and the same diluent is heat proof because the flux does not include a combustible and volatile organic solvent such as the isopropylalcohol, and therefore the flux may be heated up, for example, to 100° C.-150° C. in the flux storing tank of the automatic soldering device and may be coated to the base board to be soldered so as to heat the latter up to a desired temperature with a reduced time approximately ¼ to 1/6 of the time required by the conventional preliminary heating device. Moreover even a considerably thick base board may be wholly and evenly heated. In this case, the flux will not be discolored and denatured and will produce no nasty smell, no poisonous gas and no danger of fire by combustion. Thus the flux will heighten an effective soldering property as well as a solder coating property.

Table 3 shows the soldering fluxes composed in accordance with the invention, properties of which have been evaluated by the moniscograph. It has been found that the fluxes are superior to the conventional ones available in the market especially in the case of soldering brass and nickel.

Between the flux coating device 13 and the solder storing tank 14, an air curtain device 62 is activated to

TABLE 3

| Flux No. | TCP | BXA | OPA *1 | DBP *2 | Rosin | Copper | | Brass | | Nickel | |
|---|---|---|---|---|---|---|---|---|---|---|---|
| | | | | | | Solder coating speed (sec.) | Relative adhesiveness *3 | Solder coating speed (sec.) | Relative adhesiveness *3 | Solder coating speed (sec.) | Relative adhesiveness *3 |
| 5 | 100 | 0 | 5 | 2 | 0 | 0.25 | 166 | 0.19 | 173 | 0.45 | 125 |
| 6 | 100 | 0 | 3 | 5 | 0 | 0.27 | 177 | 0.19 | 189 | 0.10 | 85 |
| 4 | 80 | 20 | 5 | 2 | 0 | 0.25 | 187 | 0.19 | 184 | 0.60 | 119 |
| 25 | 80 | 20 | 3 | 2 | 0 | 0.25 | 174 | — | — | 1.27 | 70 |
| 27 | 80 | 20 | 3 | 1 | 0 | 0.24 | 187 | — | — | 1.77 | 38 |
| 26 | 70 | 39 | 3 | 2 | 0 | 0.24 | 181 | — | — | 2.00 | 0 |
| 20 | 52 | 48 | 4 | 2 | 0 | 0.23 | 180 | — | — | 1.08 | 93 |
| 22 | 52 | 48 | 4 | 2 | 10 | 0.22 | 180 | — | — | 1.49 | 80 |
| 1 | 50 | 50 | 5 | 2 | 0 | 0.24 | 183 | 0.19 | 179 | 0.95 | 94 |
| 3 | 20 | 80 | 5 | 2 | 0 | 0.23 | 177 | 0.18 | 188 | 1.42 | 65 |
| 2 | 0 | 100 | 5 | 2 | 0 | 0.28 | 176 | 0.18 | 183 | 1.22 | 52 |
| Flux available in the market | | | | | | 0.22 | 169 | 0.20 | 139 | 0.50 | no solder coating |

*1 Orthophosphoric acid
*2 Dibromopropanol
*3 Denotes the relative value of solder coating adhesiveness. The higher the value, the higher the solder coating adhesiveness. In the case where there is no solder coating, the value becomes minus (—).

Now in reference to FIGS. 1 through 8, the automatic soldering apparatus 11 of the invention has the flux coating device 13 including the flux storing tank 33 in which the flux 49 of the invention is stored, and the heater 29 composed of the heat generator elements 30 is electrically energized. Thus the flux storing tank 33 is heated and accordingly the flux 49 is heated up to 40° C.–120° C. while the solder storing tank 14 is heated by the heater 26 electrically energized and the solder 25 is melted in the tank 14.

Figure 3:
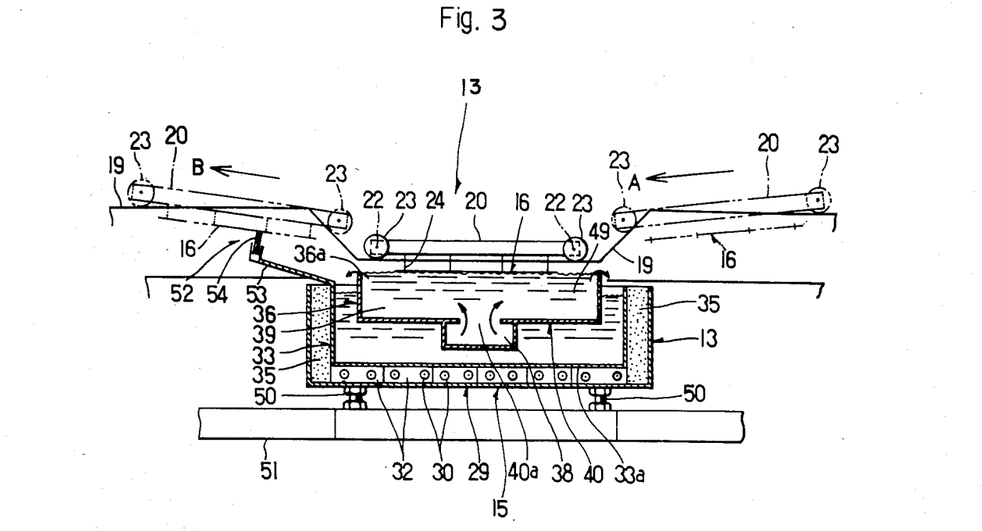
FIG. 3 is a vertically sectioned front view of a flux coating device of the apparatus.
Figure 4:
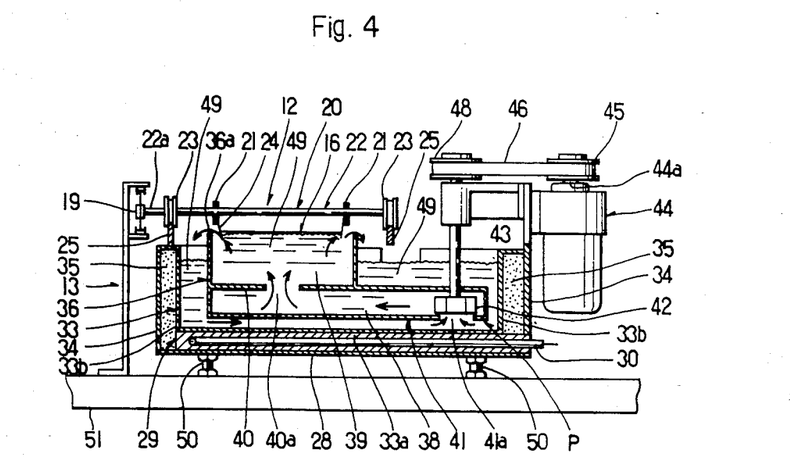
FIG. 4 is a vertically sectioned side view of the flux coating device as shown in FIG. 3.
Figure 8:
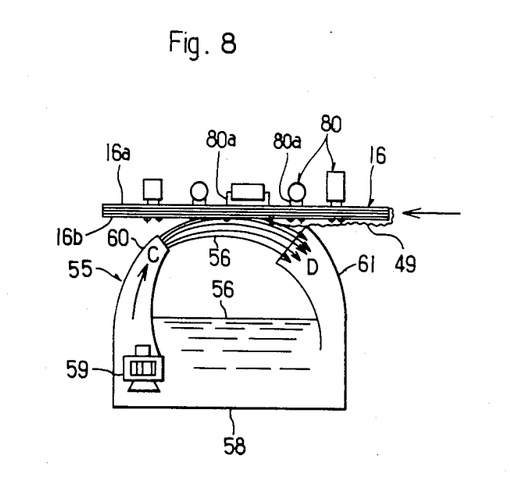
FIG. 8 is a diagramatic front view of a washing and cooling device shown partly in vertical section of the apparatus, in which a base board is shown as being washed and cooled down.

As the carrier 20 loaded with the base board 16 is transported by the transporting device 12 in the direction indicated by the arrow A in FIG. 3 and the endless chain 19 comes down to a level where the base board 16 contacts the flux 49 in the overflow tank 36 of the flux coating device 13 where the flux 49 is sucked up by the impeller 42 which is rotated by the motor 44 through the pulley 45, the belt 46, the other pulley 48 and the rotational shaft 43, and is flowing through the flux supplying section 38 into the flux overflowing section 39 where flux 49 is overflowing into the flux storing tank 33. The flux 49 thus circulating is heated while it is flowing on the bottom plate 33a of the tank 33. The flux 49, which contacts the underside of the base board 16, is therefore kept heated at an optional predetermined temperature at all times. Since the flux 49 is of a remarkably higher density and of a larger heat capacity compared with the air as the heating medium in the conventional preliminary heating device, the flux 49 will heat all the parts of base board 16 evenly in a short time approximately ¼–1/6 of the time required by the conventional preliminary heating device. Thus the base board 16 is coated with the flux and simultaneously heated while the transporting device 12 is stopped for several seconds. Then the transporting device 12 is operated again and the endless chain 19 moves up in the direction as indicated by the arrow B and accordingly the base board 16 on the carrier 20 is moved away from the flux 49. In this case, an excessive amount of the heated flux 49 is attached to the base board 16 compared with the case of the flux of normal temperature. The excess amount of the flux is removed when the base board 16 is moved past and in sliding contact with the brush 54 of the excess flux removing device 52.

maintain the heated base board 16 in a given temperature until the base board 16 is transported to the solder storing tank 14, where the base board 16 as carried by the carrier 20 comes down to the surface of the melted solder and is contacted to the melted solder 25. Thus, the base board 16 is coated with the solder. In this case, in contrast to the prior art, the base board 16 having all parts evenly heated is well coated with the solder. It has been proven that the solder has been coated well on a big sized multilayer base board or even on a generally less heat conductive ceramic base board. For example, in reference to FIG. 7 showing a 4-layer base board 16, such a base board will have a considerable temperature discrepancy between the upper and lower faces 16a, 16b in accordance to the conventional preliminary heating method, and therefore the solder coated on the lower face 16b will not come up to the upper face 16a. Even if the solder comes up to the upper face 16a, the solder will not be coated in a desired condition, for example, on the leads 80a and the terminals thereof as shown in FIG. 8. Whereas according to the invention, there is no substantial temperature discrepancy between the lower face 16b and the upper face 16a of the 4-layer base board 16 and therefore the solder will easily come up to the upper face 16a and up to the electronic elements 80 arranged thereon. As a result, the base board 16 is coated with the solder in a desired condition.

When the melted solder 25 is coated on the base board 16 in this way, the transporting device 12 is activated again to transport the base board 16 to the cooling and washing device 55 where the jetting pump 59 is activated to jet the washing fluid 56 from the nozzle 60 in the direction C to D into the fluid receiver 61 as shown in FIG. 8 such that the washing fluid 56 will circulate all round the fluid storing casing 58 with a fast speed. The jetting fluid 56 will wash away the extra flux and solder from the base board 16 and simultaneously cool down the base board 16 and the solder 25 coated thereon. Thus the series of solder coating processes are finished. The solder coated base board 16 may be brought in contact with the washing fluid 56 as the latter is kept at a standstill in order to obtain the same washing and cooling effect on the base board.

According to this embodiment, the flux storing tank 33 of the flux coating device 13 and the heater 29 are comparatively big in capacity, but the whole structure is simple and of low cost. Further, the transporting device may be incessantly driven without interruption at the flux coating device and at the solder coating device.

Further in reference to FIGS. 9 and 10 showing the second embodiment of the invention, the automatic solder coating apparatus 71 includes a transporting device 72, in which as the carrier 20 loaded with the base board 16 is transported by the endless chain 19, in the direction as indicated by the arrow marked E, to the position just above the flux coating device 73, the cylinders 78 are operated to move down the respective piston rods 79 to thereby bring down through the coupling plates 76 a part of the rails 75, on which the carrier 20 is located, to the position illustrated in the solid line from the position illustrated in the imaginary line. Thus the lower face of the base board 16 is contacted to the heated flux 49 and the base board 16 is coated with the flux and is simultaneously heated. In the meantime, the transporting endless chain 19 is stopped.

When the base board 16 is coated with the flux 49 and heated at the same time, the cylinders 78 are operated again to move up the respective piston rods 79 to thereby move up the part of the rails 75 to the level of the remaining rails. Then, the endless chain 19 is activated again to transport the carriage 20 in the direction indicated by the arrow marked E to the subsequent solder coating stage. According to this embodiment, the carrier 20 moves up and down in the directions as shown by the arrows marked F and G directly above the flux coating device 73, and therefore it becomes necessary to stop the transporting device 72 when the base board 16 is coated with the flux 49. Moreover, in the second embodiment the cylinders 78 and the other related members are required, and accordingly the device becomes more complex and costly than the device of the first embodiment. The flux storing tank 33 and the heater 29 may however be made smaller than those of the first embodiment.

Embodiment 1

The temperature rise of the board (print circuited base board) has been compared between the case in which the base board is heated by the conventional infrared heater of the automatic solder coating apparatus and the case in which the base board is heated by the flux coating device of the present invention.

As a test piece, a copper lamination plate (50 mm×50 mm) was used, which was processed with glass basis epoxy resin and formed with the insulation resistance measuring comb typed electrodes in accordance with C6480 of the Japanese Industrial Standards (JIS). The test piece was heated at the face on which the electrodes are provided, and the temperature rise on the opposite face was measured until a predetermined temperature was reached as indicated by an unreversible thermo label attached to the face of the test piece.

In the case of heating the test piece by the infrared heater, the test piece was placed in such a manner that the face having the electrodes was heated up to about 120° C. In the case of heating the test piece by the heated flux,
The composition of flux:
  100% by weight of tricresylphosphate
  3% by weight of phosphoric acid
  5% by weight of 2,3-diburomopropanol As the result, by the conventional method, it took 28 sec. until the outer face of the test piece was heated up to 43° C., 45 sec. until the outer face was heated up to 48° C., 90 sec. until the outer face was heated up to 71° C., 110 sec. until the outer face was heated up to 76° C., and 135 sec. until the outer face was heated up to 82° C.

Whereas by the method of the present invention, it took 7 sec. until the outer face was heated up to 43° C. (time is ¼ as compared with the conventional method), 10 sec. until the outer face was heated up to 48° C. (time is 1/4.5), 17 sec. until the outer face was heated up to 71° C. (time is 1/5.3), 20 sec. until the outer face was heated up to 76° C. (time is 1/5.5), and 23 sec. until the outer face was heated up to 82° C. (time is 1/5.9).

It is apparent from the test results as mentioned above that the heating time of the base board according to the invention has been reduced to ¼–1/6 as compared to the conventional method. Although the data is not disclosed herein, the same test was applied to a big sized base board by the method of the invention, and it was found that the temperature distribution was more even than compared with the conventional method.

Embodiment 2

With the condition as mentioned below, the face of a gloss basis epoxy print base board was contacted to the heated flux and then was coated with the solder.
Composition of flux:
  100% by weight of dibutylglicoladipate
  3% by weight of phosphoric acid
  2% by weight of 2,3-diburomopropanol
Temperature of the flux: 120° C.
Contacting time: 30 sec.

At this time, the face of the test piece on which the electronic elements were arranged, i.e. the face opposite to the flux contacting face was about 90° C.

The test piece was contacted to the melted solder of 250° C. for 2 sec. Immediately after that, the solder coating was finished in 5 sec.

Whereas in the conventional method, the flux (including isopropylalcohol as a solvent) generally available in the market, which is composed of denatured rosin as a main element and various sorts of amine hydrochlorides and hydrobromic phosphates, was coated to the same test piece, and then the test piece was heated by the infrared heater for about one minute until the outer face was heated up to about 90° C. while the solvent was removed. The heated test piece was contacted to the melted solder, and as the result, the solder started to come up through the holes provided in the test piece in 5 sec. after the contact and the solder coating was finished in 10 sec.

Thus it is apparent that the solder coating method and the device thereof according to the invention are remarkably superior to those of the conventional one.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A method for automatically soldering a printed base board comprising the steps of:
    (a) heating a flux up to a predetermined temperature in a range of 100° C.–150° C.;
    (b) contacting said heated flux to a face of said printed base board to thereby coat said face of said printed base board and to simultaneously heat said printed base board with said heated flux until said printed base board is heated up to said predetermined temperature of said flux; and (c) contacting said face of said printed bae board to a melted solder of a higher soldering temperature.

2. A method as defined in claim 1, wherein said flux is a dissolution or a mixture of a solvent which is incombustible or of low ignitability and of low evaporability, an activator which may be activated by a temperature higher than that of said heated flux and is stabilized with the temperature of said heated flux and an additive which is easily soluble with said solvent and said activator.

3. A method as defined in claim 2, wherein said flux includes tricresylphosphate, phosphoric acid and 2,3-dibromopropanol.

4. A method as defined in claim 3, wherein said flux includes dibutylglycoladipate, phosphoric acid and 2,3-dibromopropanol.

5. A method as defined in claim 1, wherein said step of contacting said heated flux to said face of said printed base board includes a step of contacting said face of said printed base board progressively from the flux of lower temperature to the flux of higher temperature.

6. A method as defined in claim 4, wherein said flux includes phosphoric acid as an activator and a liquid of incombustibility which is harmless to the effect of said phosphoric acid for soldering said printed base board.

7. A method as defined in claim 6, wherein said flux includes phosphoric acid as an activator and a diluent which is one or more diluents selected from tricresylphosphate, cresylphenylphosphate, tributoxyethylphosphate, dibutyladipate, dibutylglycoladipate and dibutylmaleate.

8. A method as defined in claim 7, wherein said flux includes phosphoric acid as an activator, a diluent which is incombustible and easily soluble with said phosphoric acid and harmless to the effect of said phosphoric acid for soldering said printed base board and an additive which is easily soluble with said phosphoric acid and said diluent and increases the soldering effect of said flux, said additive being at least a selected one of rosin, phenol resin denatured rosin and 2,3-dibromopropanol.

9. An automatic soldering apparatus, for a printed base board, comprising means for transporting said printed base board to be soldered; means for coating said printed base board with a flux, said flux coating means including a tank in which a fused flux is stored and heater means for heating said flux up to 100° C.-150° C., said heated flux being contacted to one face of said printed base board such that said heated flux is coated on said face of said base board and simultaneously heats said printed base board up to said temperature of said heated flux; means for soldering said flux coated printed base board, said soldering means including a tank in which a melted solder is stored so as to be contacted to said face of said printed base board as the latter is transported to said solder storing tank; and means for cooling and washing said solder coated printed base board as the latter is transported past said cooling and washing means.

10. An automatic soldering apparatus as defined in claim 9, further comprising means for generating an air curtain between said flux storing tank and said solder storing tank, said air curtain being effective to maintain the temperature of said printed base board heated at said flux storing tank.

11. The automatic soldering apparatus as defined in claim 9, wherein said flux heater means comprises a plurality of aluminum heat generators, each of which has a heat generating element embedded in an aluminum block which is provided as integral with said flux storing tank.

12. The automatic soldering apparatus as defined in claim 11, wherein said flux storing tank comprises inner and outer surrounding plates and has a heat insulating material provided between the inner and the outer surrounding plates.

* * * * *

UNITED STATES PATENT AND TRADEMARK OFFICE
CERTIFICATE OF CORRECTION

PATENT NO. : 4,684,054

DATED : August 4, 1987

INVENTOR(S) : Yamahiro Iwasa et al

It is certified that error appears in the above-identified patent and that said Letters Patent is hereby corrected as shown below:

Column 13, line 5, change "bae" to --base--; and line 8, change "dissolution" to --solution--.

Signed and Sealed this

Fifth Day of January, 1988

Attest:

DONALD J. QUIGG

Attesting Officer

Commissioner of Patents and Trademarks